(12) United States Patent
Usuda

(10) Patent No.: US 12,347,478 B2
(45) Date of Patent: Jul. 1, 2025

(54) VOLTAGE GENERATION CIRCUIT AND INTERFACE CIRCUIT

(71) Applicant: KIOXIA CORPORATION, Tokyo (JP)

(72) Inventor: Masayuki Usuda, Ota Tokyo (JP)

(73) Assignee: Kioxia Corporation, Tokyo (JP)

( * ) Notice: Subject to any disclaimer, the term of this patent is extended or adjusted under 35 U.S.C. 154(b) by 364 days.

(21) Appl. No.: 17/897,067

(22) Filed: Aug. 26, 2022

(65) Prior Publication Data
US 2023/0197139 A1  Jun. 22, 2023

(30) Foreign Application Priority Data
Dec. 17, 2021 (JP) .................... 2021-205558

(51) Int. Cl.
*G11C 11/00* (2006.01)
*G11C 11/4074* (2006.01)
*G11C 11/4094* (2006.01)

(52) U.S. Cl.
CPC ...... *G11C 11/4074* (2013.01); *G11C 11/4094* (2013.01)

(58) Field of Classification Search
CPC .................. G11C 11/4074; G11C 11/4094
See application file for complete search history.

(56) References Cited

U.S. PATENT DOCUMENTS

| | | | |
|---|---|---|---|
| 6,392,944 B1 | 5/2002 | Kono | |
| 7,852,145 B2 | 12/2010 | Uematsu et al. | |
| 9,104,221 B2 | 8/2015 | Kim | |
| 10,164,651 B2 * | 12/2018 | Aruga | H03M 1/38 |
| 2020/0401178 A1 * | 12/2020 | Jung | H03L 7/097 |
| 2022/0003800 A1 * | 1/2022 | Stewart | H01L 27/0688 |

* cited by examiner

*Primary Examiner* — Pho M Luu
(74) *Attorney, Agent, or Firm* — Kim & Stewart LLP

(57) ABSTRACT

A voltage generation circuit includes a first input terminal at a power supply voltage, a second input terminal at a reference voltage, an output terminal, a resistor circuit, and a capacitor circuit. The resistor circuit includes resistors connected in series between the first and second input terminals and switching elements connected between the output terminal and a respective one of a plurality of nodes. The capacitor circuit includes a plurality of capacitors, each of which has a first terminal to which a first voltage or a second voltage is applicable and a second terminal connected to the output terminal. The first voltage or the second voltage is selectively applied to the first terminals of the capacitors in accordance with a target value of an output voltage.

19 Claims, 12 Drawing Sheets

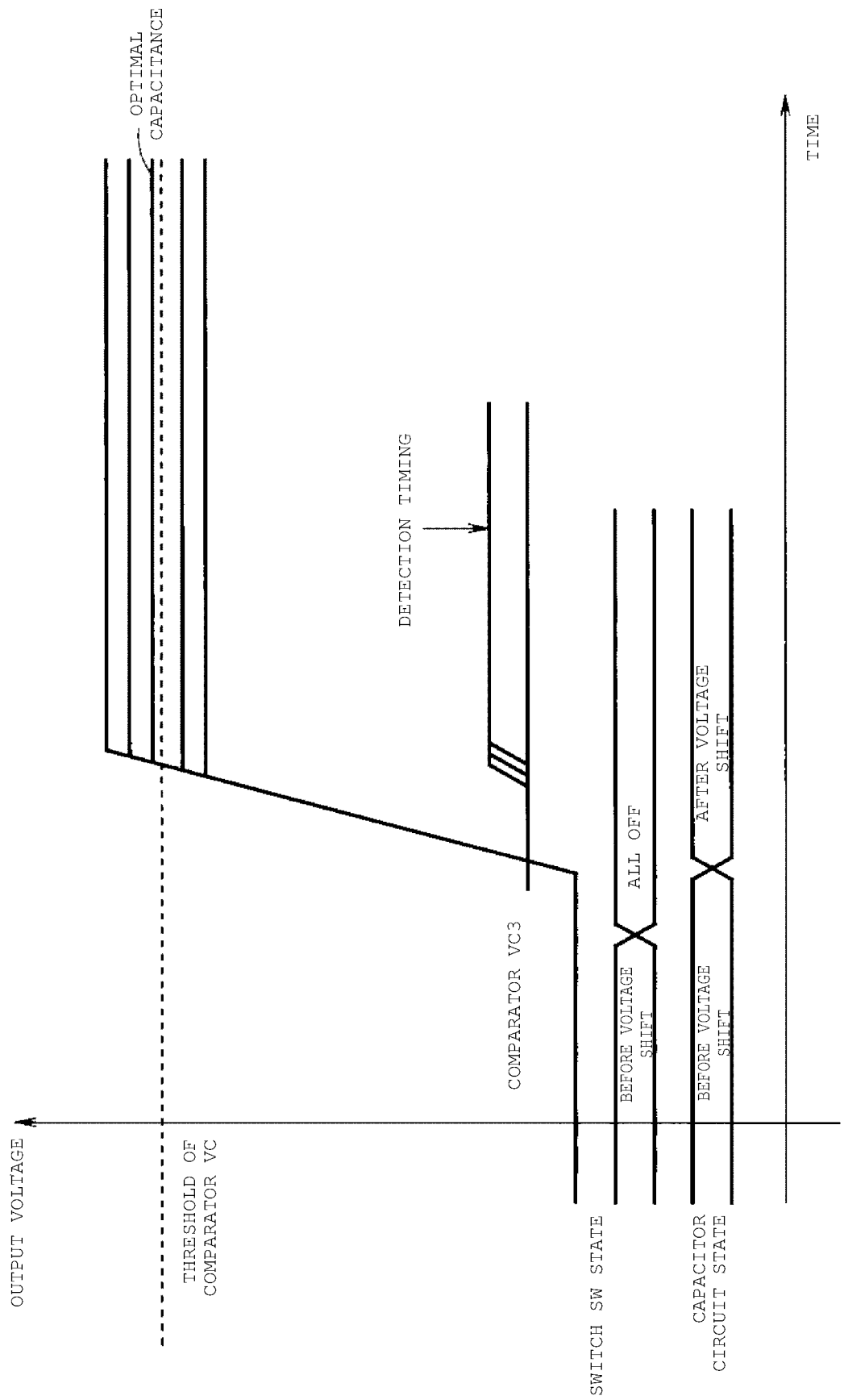

VOLTAGE GENERATION CIRCUIT AND INTERFACE CIRCUIT

CROSS-REFERENCE TO RELATED APPLICATIONS(S)

This application is based upon and claims the benefit of priority from Japanese Patent Application No. 2021-205558, filed Dec. 17, 2021, the entire contents of which are incorporated herein by reference.

FIELD

Embodiments described herein relate generally to a voltage generation circuit and an interface circuit having the same.

BACKGROUND

A semiconductor device includes a voltage generation circuit that generates a reference voltage. The reference voltage is used in the semiconductor device. This type of voltage generation circuit can generate a plurality of voltage values, for example, as a reference voltage for determining a logic level of a signal to be processed.

It is desirable to reduce time required to change the voltage value of the reference voltage in the voltage generation circuit.

BRIEF DESCRIPTION OF THE DRAWINGS

FIG. 12 is a diagram to explain an operation of the voltage generation circuit according to the fourth embodiment.

DETAILED DESCRIPTION

Embodiments provide a voltage generation circuit and an interface circuit capable of reducing time required to change a voltage value.

In general, according to an embodiment, a voltage generation circuit includes a first input terminal at a power supply voltage, a second input terminal at a reference voltage lower than the power supply voltage, an output terminal from which an output voltage is output, a resistor circuit, and a capacitor circuit. The resistor circuit includes a plurality of resistors connected in series between the first input terminal and the second input terminal and a plurality of switching elements connected between the output terminal and a respective one of a plurality of nodes between adjacent two of the resistors. The capacitor circuit includes a plurality of capacitors, each of which has a first terminal to which a first voltage or a second voltage is applicable and a second terminal connected to the output terminal. The first voltage or the second voltage is selectively applied to the first terminals of the capacitors in accordance with a target value of the output voltage.

Hereinafter, embodiments of the present disclosure will be described in detail with reference to the drawings.

FIRST EMBODIMENT

A voltage generation circuit according to a first embodiment generates voltages of different values. The voltage generation circuit includes a plurality of capacitors connected to an output terminal that outputs the generated voltage. Each of the plurality of capacitors has a voltage boost function or a voltage drop function. With the configuration, the voltage generation circuit according to the first embodiment can reduce a time required to change a generated voltage value. Details of a configuration and an operation of the voltage generation circuit according to the first embodiment will be described below.

Figure 1:
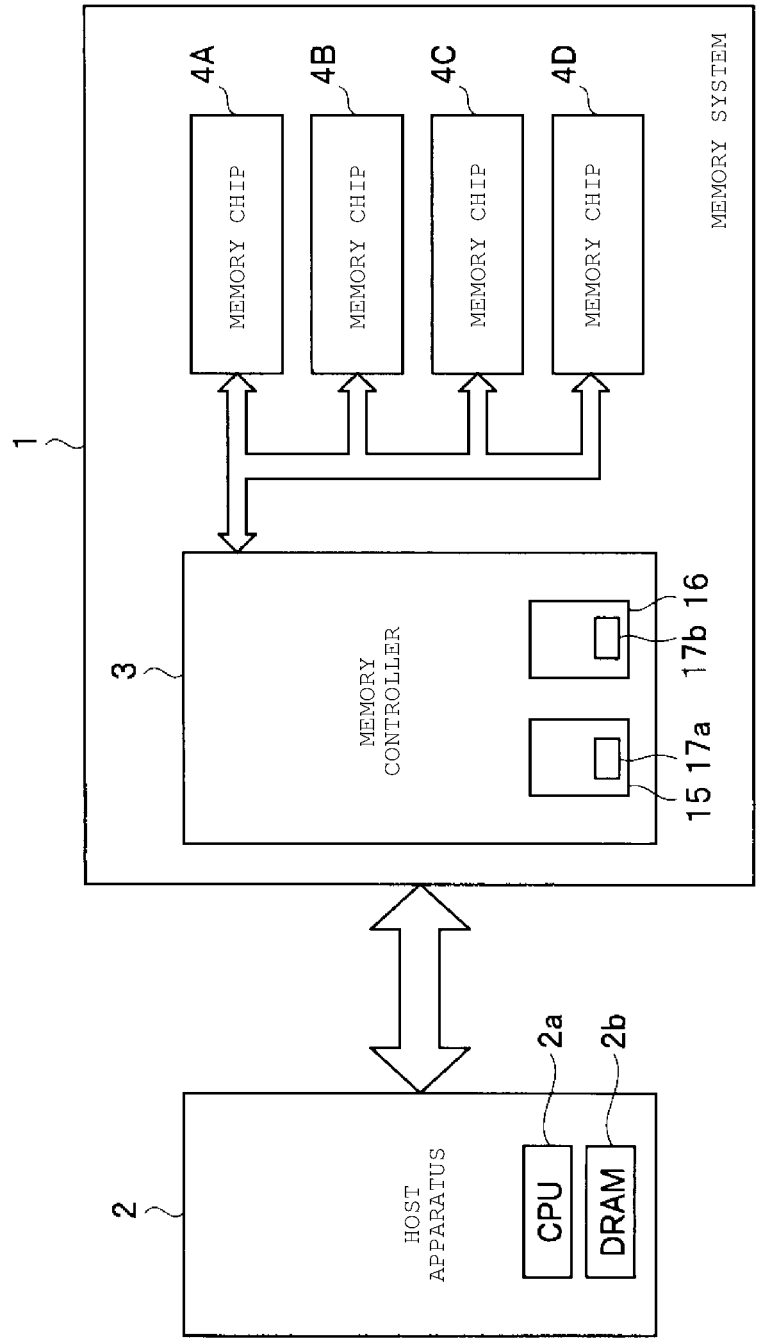
FIG. 1 is a block diagram illustrating an example of a specific configuration of a memory system including a voltage generation circuit according to a first embodiment.

FIG. 1 is a block diagram illustrating an example of a specific configuration of a memory system including a voltage generation circuit according to the first embodiment.

In FIG. 1, a memory system 1 includes a memory controller 3 and four memory chips 4A to 4D. Hereinafter, when there is no need to distinguish among the four memory chips 4A to 4D, the four memory chips are collectively referred to as memory chips 4. The number of memory chips 4 is not limited to four and may be any number of one or more.

The memory system 1 can be connected to a host apparatus 2. The host apparatus 2 is, for example, an electronic apparatus such as a personal computer, a mobile terminal, an in-vehicle device, or a server. The host apparatus 2 includes a central processing unit (CPU) 2a as a processor, a ROM (not illustrated), and a DRAM 2b. In response to a request from the host apparatus 2, the memory system 1 stores data from the host apparatus 2 (hereinafter, simply referred to as data) in the respective memory chips 4 or reads data stored in the respective memory chips 4 to output the data to the host apparatus 2. Specifically, the memory system 1 can write data to the respective memory chips 4 in response to write requests from the host apparatus 2 and can read data from the respective memory chips 4 in response to read requests from the host apparatus 2.

The memory system 1 may be a universal flash storage (UFS) device or the like in which the memory controller 3 and the plurality of memory chips 4 are configured as one package or may be a solid state drive (SSD) or the like. FIG. 1 illustrates a state in which the memory system 1 is connected to the host apparatus 2.

The memory controller 3 includes a host interface circuit 15 that transmits and receives data to and from the host apparatus 2. Further, the memory controller 3 includes a memory interface circuit 16 that transmits and receives data to and from the respective memory chips 4. The host interface circuit 15 includes a voltage generation circuit 17a, and the memory interface circuit 16 includes a voltage generation circuit 17b. Configurations of the host interface circuit 15 and the memory interface circuit 16 are described below.

The memory chips 4 are semiconductor memory devices implemented with NAND flash memory or the like that non-volatilely store data. As illustrated in FIG. 1, the memory controller 3 is connected to the respective memory chips 4 through a NAND bus. The memory controller 3 controls writing of data to the memory chips 4 according to write requests from the host apparatus 2. Further, the memory controller 3 controls reading of data from the memory chips 4 according to read requests from the host apparatus 2. The memory controller 3 may voluntarily control writing and reading of data to and from the memory chips 4 not by requests from the host apparatus 2.

Figure 2:
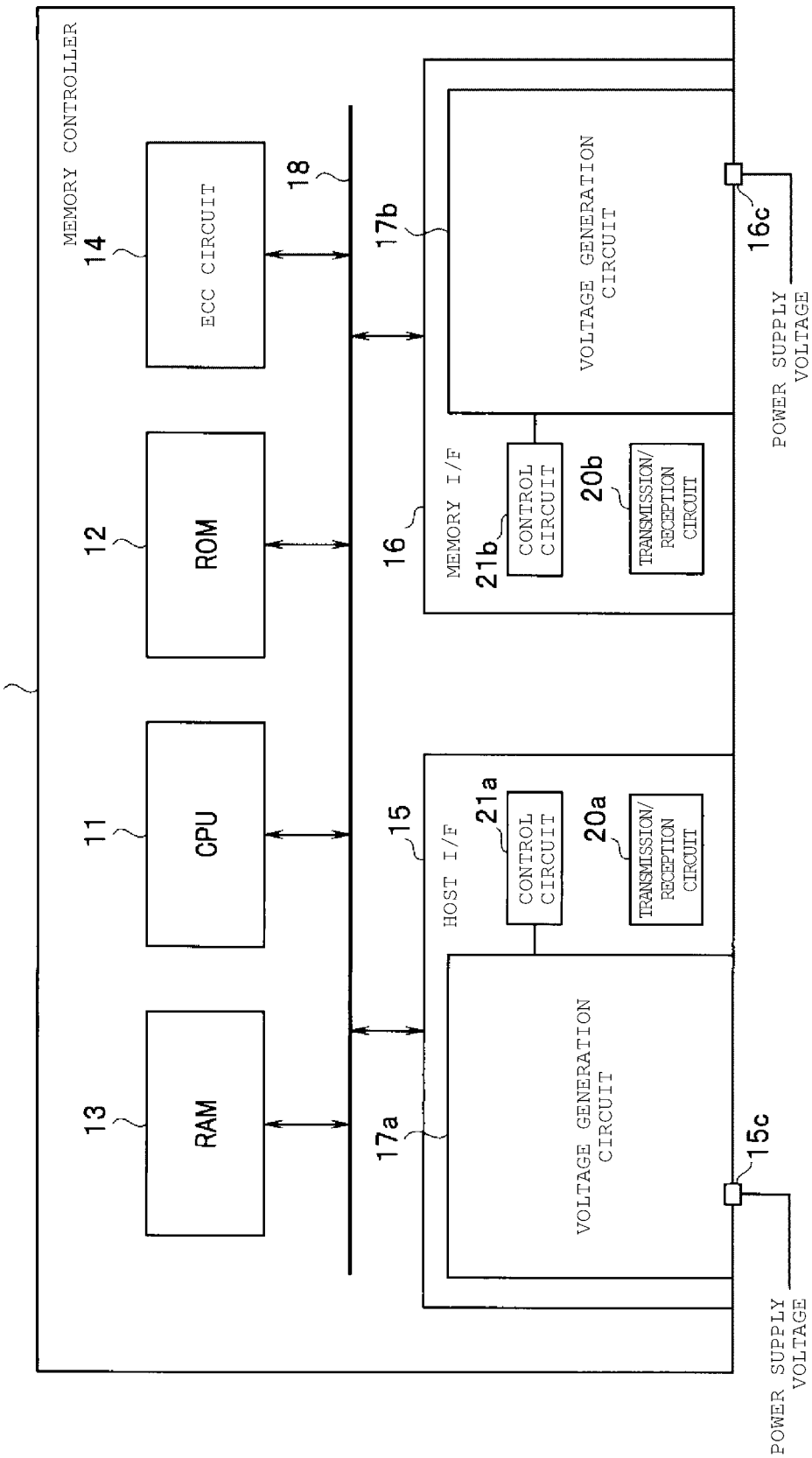
FIG. 2 is a block diagram illustrating an example of a configuration of a memory controller including the voltage generation circuit according to the first embodiment.

FIG. 2 is a block diagram illustrating an example of a configuration of the memory controller including the voltage generation circuit according to the first embodiment. In FIG. 2, the memory controller 3 includes a central processing unit (CPU) 11, a ROM 12, a random access memory (RAM) 13, an error check and correct (ECC) circuit 14, the host interface (I/F) circuit 15, and the memory I/F circuit 16. The CPU 11, the ROM 12, the RAM 13, the ECC circuit 14, the host I/F circuit 15, and the memory I/F circuit 16 are connected to each other by an internal bus 18.

The host I/F circuit 15 includes the voltage generation circuit 17a, a transmission/reception circuit 20a, and a control circuit 21a. The control circuit 21a may be configured with a processor using a CPU, a field programmable gate array (FPGA), or the like. The control circuit 21a may operate according to a program stored in a memory (not illustrated) to control each unit of the host I/F circuit or may implement some or all of functions thereof by using an electronic circuit of hardware. The control circuit 21a controls respective units of the host I/F circuit 15. The transmission/reception circuit 20a receives data from the host apparatus 2 and outputs a request included in the received data, write data, and the like to the internal bus 18. Further, the transmission/reception circuit 20a of the host I/F circuit 15 transmits data read from the memory chips 4, a response from the CPU 11, and the like to the host apparatus 2. The host apparatus 2 also includes an I/F circuit (not illustrated) corresponding to the host I/F circuit 15.

The host apparatus 2 is connected to the host I/F circuit 15 through a predetermined interface. For example, various interfaces such as a parallel interface of embedded multimedia card (eMMC), a serial extension interface of peripheral component interconnect-express™ (PCIe™), and a high-speed serial interface of UFS are adopted as the interface.

The voltage generation circuit 17a of the host I/F circuit 15 generates voltages used in the host I/F circuit 15. For example, the voltage generation circuit 17a generates reference voltages having a plurality of different values used for determining a logic level of data from the host apparatus 2.

The memory I/F circuit 16 includes the voltage generation circuit 17b, a transmission/reception circuit 20b, and a control circuit 21b. The control circuit 21b may be implemented by a processor using a CPU, an FPGA, or the like. The control circuit 21b may operate according to a program stored in a memory (not illustrated) to control each unit of the memory I/F circuit 16 or may implement some or all of functions thereof by using an electronic circuit of hardware.

The control circuit 21b controls respective units of the memory I/F circuit 16. The transmission/reception circuit 20b controls processing of writing data to the respective memory chips 4 and processing of reading data from the respective memory chips 4 based on instructions of the CPU 11. The voltage generation circuit 17b of the memory I/F circuit 16 has the same configuration as the voltage generation circuit 17a of the host I/F circuit 15. The voltage generation circuit 17b generates voltages used in the memory I/F circuit 16. For example, the voltage generation circuit 17b generates reference voltages having a plurality of different values used for determining a logic level of data from the memory chips 4.

The voltage generation circuits 17a and 17b respectively include power supply terminals 15c and 16c. Power supply voltages are respectively applied to the power supply terminals 15c and 16c from the outside. The voltage generation circuits 17a and 17b generate desired voltages by using the power supply voltages supplied from the power supply terminals 15c and 16c.

The CPU 11 comprehensively controls the memory controller 3. The CPU 11 configuring a control circuit is, for example, a central processing unit (CPU), a micro processing unit (MPU), or the like. When receiving a request from the host apparatus 2 via the host I/F circuit 15, the CPU 11 performs a control according to the request. For example, the CPU 11 instructs the memory I/F circuit 16 to write data to the respective memory chips 4 according to the requests from the host apparatus 2. Further, the CPU 11 instructs the memory I/F circuit 16 to read data from the respective memory chips 4 according to the requests from the host apparatus 2.

The RAM 13 temporarily stores data received from the host apparatus 2 until the data is stored in the respective memory chips 4 or temporarily stores data read from the respective memory chips 4 until the data is transmitted to the host apparatus 2. The RAM 13 is a general-purpose memory such as a static random access memory (SRAM) or a dynamic random access memory (DRAM). Further, the RAM 13 has a region for storing a logical-to-physical address conversion table. The logical-to-physical address conversion table is information indicating correspondence between a logical address (e.g., logical address managed by the host apparatus 2) of data from the host apparatus 2 and a physical address of the memory chip 4 to which the data is written.

The CPU 11 determines a storage region (hereinafter, referred to as a memory region) of each of the memory chips 4 for data stored in the RAM 13. Data is stored in the RAM 13 via the internal bus 18. The CPU 11 determines the memory region for, for example, data of a page unit which is a write unit of the memory chip 4, that is, page data.

A physical address is assigned to the memory region of the memory chip 4. The CPU 11 manages a memory region of a write destination of data by using a physical address. The CPU 11 instructs the memory I/F circuit 16 to designate a physical address of a determined memory region and to write data to the memory chip 4. The CPU 11 stores the logical-to-physical address conversion table in the RAM 13. When receiving a read request including a logical address from the host apparatus 2, the CPU 11 specifies a physical address corresponding to the logical address with reference to the logical-to-physical address conversion table, designates the physical address, and instructs the memory I/F circuit 16 to read data.

The ECC circuit 14 encodes data stored in the RAM 13 to generate code words. Further, the ECC circuit 14 decodes the code words read from the respective memory chips 4.

FIG. 2 illustrates a configuration example in which the memory controller 3 includes the ECC circuit 14 and the memory I/F circuit 16. Meanwhile, the ECC circuit 14 may be included in the memory I/F circuit 16. Further, the ECC circuit 14 may be included in each of the memory chips 4.

When receiving a write request from the host apparatus 2, the memory controller 3 operates as follows. The CPU 11 temporarily stores write data in the RAM 13. The CPU 11 reads data stored in the RAM 13 and inputs the data to the ECC circuit 14. The ECC circuit 14 encodes the input data into a code word and inputs the code word to the memory I/F circuit 16. The memory I/F circuit 16 writes the input code word to the memory chip 4.

When receiving a read request from the host apparatus 2, the memory controller 3 operates as follows. The memory I/F circuit 16 inputs to the ECC circuit 14 a code word read from each of the memory chips 4. The ECC circuit 14 decodes the input code word and stores the decoded data in the RAM 13. The CPU 11 transmits data stored in the RAM 13 to the host apparatus 2 through the host I/F circuit 15.

Figure 3:
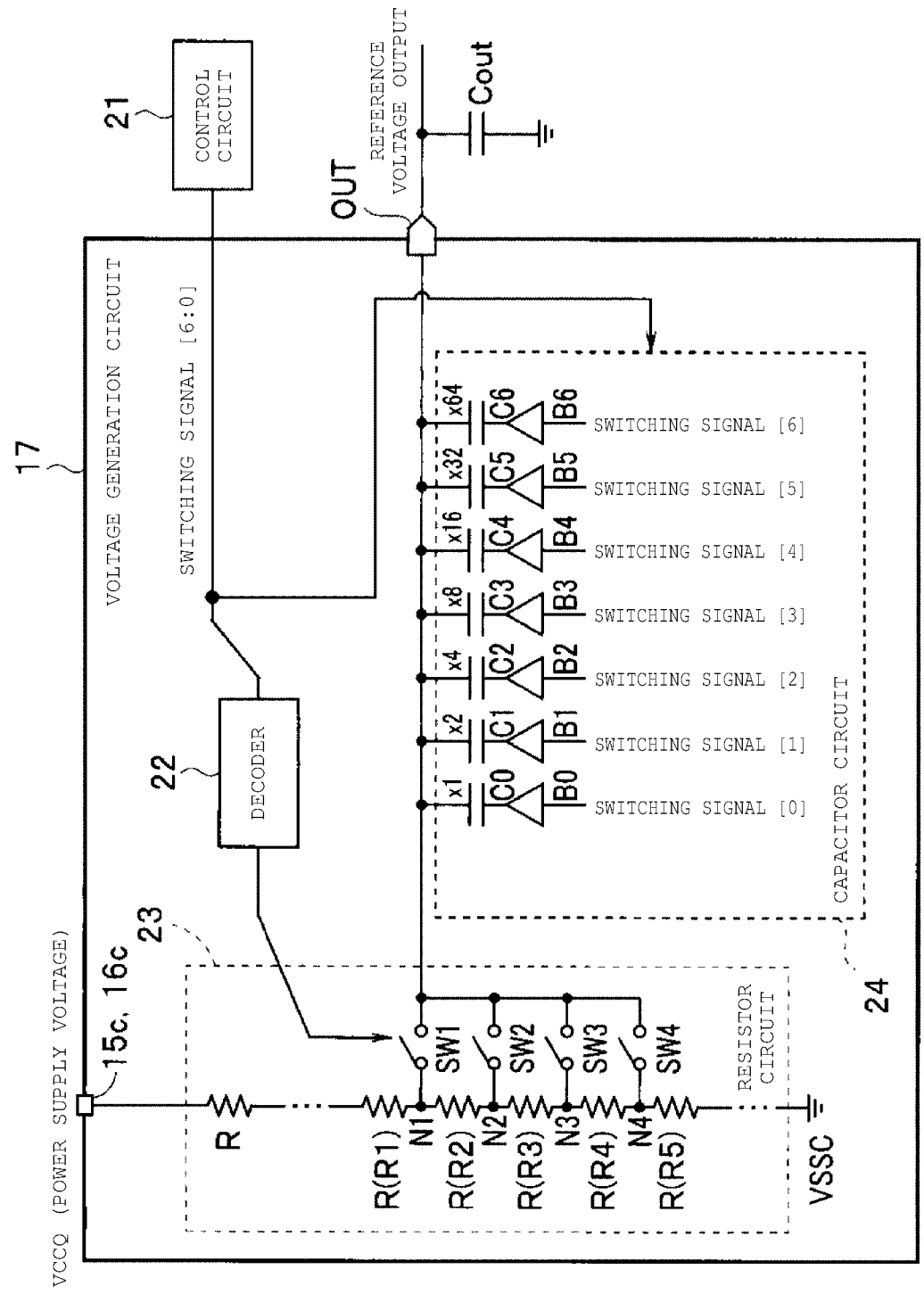
FIG. 3 is a circuit diagram illustrating a specific configuration of the voltage generation circuit according to the first embodiment.

FIG. 3 illustrates a specific configuration of one of the voltage generation circuits 17a and 17b in FIG. 2. The voltage generation circuits 17a and 17b have the same configuration as each other and are illustrated as a voltage generation circuit 17 in FIG. 3. Further, the control circuits 21a and 21b have the same configuration as each other and are illustrated as a control circuit 21 in FIG. 3.

The voltage generation circuit 17 includes a decoder 22, a resistor circuit 23, and a capacitor circuit 24. A power supply voltage (voltage VCCQ) is applied to the power supply terminal 15c or 16c from the outside. The resistor circuit 23 includes a plurality of resistor elements R connected in series and a plurality of switches SW1 to SW4. The plurality of resistor elements R are connected between the power supply terminal 15c or 16c and the ground. The ground is at a reference potential of the voltage generation circuit 17. The voltage generation circuit 17 includes a terminal (not illustrated) connected to the ground. Hereinafter, the switches SW1 to SW4 are collectively referred to as switches SW. The switches SW are an example of switching elements and are configured with, for example, transistors.

A plurality of connection points between adjacent resistor elements R among the plurality of resistor elements R are connected to an output terminal OUT respectively through the switches SW. In the example of FIG. 3, nodes N1 to N4, which are four connection points of the five adjacent resistor elements R1 to R5, are connected to the output terminal OUT respectively through the switches SW1 to SW4. The resistor circuit 23 causes voltages obtained by dividing the voltage VCCQ to be generated at the respective connection points according to resistance values of the respective resistor elements R. The voltages generated at the respective connection points are output to the output terminal OUT through the corresponding switches SW, respectively.

The switches SW are turned on and off by the decoder 22. Although four switches SW1 to SW4 are illustrated as the switches SW in FIG. 3, the number of switches SW may be determined according to the type of generated voltages. For example, when $2^n$ voltages are generated by an n-bit switching signal, $2^n$ switches SW may be provided. In the example of FIG. 3, the switch SW1 can supply a voltage generated in the node N1 to the output terminal OUT when the switch SW1 is turned on. Likewise, the switches SW2 to SW4 can supply voltages generated in the nodes N2 to N4 to the output terminal OUT when the switches SW2 to SW4 are turned on.

The capacitor circuit 24 is connected to the output terminal OUT. The capacitor circuit 24 includes a plurality of capacitors C0 to C6 and a plurality of buffers B0 to B6. Hereinafter, the capacitors C0 to C6 are collectively referred to as capacitors C. The capacitors C are an example of capacitor elements, and are configured with, for example, transistors. Further, hereinafter, the buffers B0 to B6 are collectively referred to as buffers B. The number of capacitors C and the number of buffers B are not limited to seven, and an appropriate number may be adopted. Based on capacitance of the capacitor C0 (×1), capacitances of the capacitors C1, C2, C3, C4, C5, and C6 are respectively set to be 2 times, 4 times, 8 times, 16 times, 32 times, and 64 times. The capacitances of the capacitors C are an example, and capacitance ratios of the capacitors C0 to C6 are not limited to FIG. 3.

One terminals of the capacitors C0 to C6 (hereinafter, referred to as first terminals) are connected to output terminals of the buffers B0 to B6, respectively. Further, the other terminals of the capacitors C0 to C6 (hereinafter, referred to as second terminals) are connected to the output terminal OUT. Switching signals [0] to [6] are respectively given to input terminals of the buffers B0 to B6. Hereinafter, the switching signals [0] to [6] are collectively referred to as switching signals [ ].

When the switching signal [ ] of a low level (hereinafter, referred to as L level) is given to an input terminal of the buffer B, an output terminal thereof goes to a ground level GND (e.g., voltage VSSC), and when the switching signal [ ] of a high level (hereinafter, referred to as H level) is given to the input terminal, the output terminal goes to H level (e.g., the voltage VCCQ).

A load circuit (not illustrated) is connected to the output terminal OUT. For example, the load circuit is the transmission/reception circuit 20a or 20b illustrated in FIG. 2. A capacitor Cout indicates a capacitor (may be referred to as a load capacitor) of the load circuit including a wiring capacitor. In the first embodiment, description will be made by ignoring the load capacitor Cout.

Figure 4:
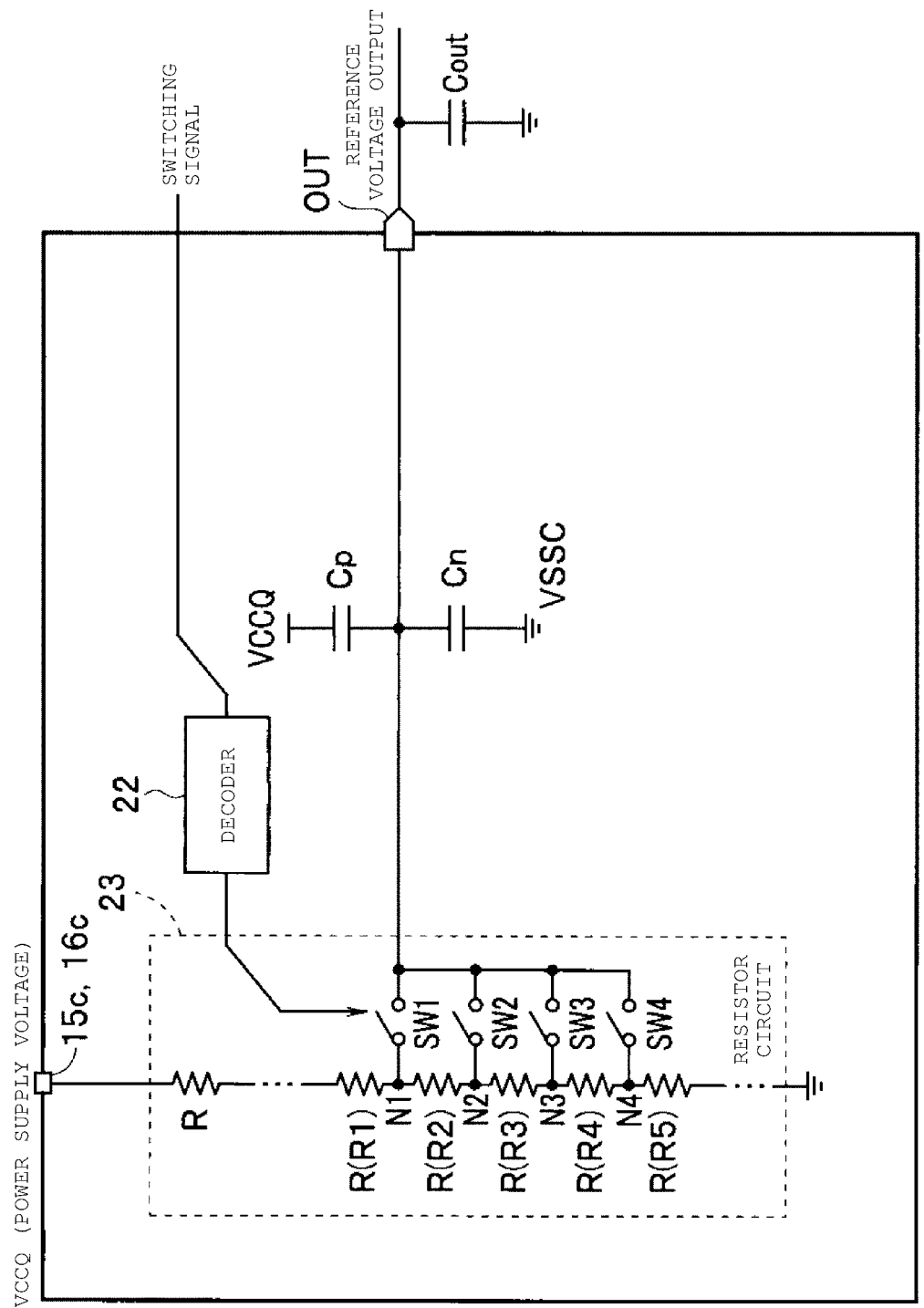
FIG. 4 is a circuit diagram illustrating an example of a configuration of a voltage generation circuit according to a comparative example.

FIG. 4 is a circuit diagram illustrating a comparative example of a voltage generation circuit. In FIG. 4, the same components as in FIG. 1 are designated by the same reference numerals, and descriptions thereof are omitted.

In the voltage generation circuit illustrated in FIG. 4, decoupling capacitors Cp and Cn are connected to the output terminal OUT. The decoupling capacitors Cp and Cn each have one terminal and the other terminal. The voltage VCCQ is applied to one terminal of the decoupling capacitor Cp, and the other terminal thereof is connected to the output terminal OUT. A ground level (e.g., voltage VSSC) is applied to one terminal of the decoupling capacitor Cn, and the other terminal thereof is connected to the output terminal OUT.

In the resistor circuit 23, one of the nodes N1 to N4 is selected by turning on one of the switches SW1 to SW4. Thereby, the resistor circuit 23 supplies a voltage generated in the selected node to the output terminal OUT as, for example, a reference voltage. The decoupling capacitors Cp and Cn reduce a change in voltage of a load circuit to which the reference voltage is supplied from the output terminal OUT.

In addition, the resistor elements R of the resistor circuit 23 have relatively great resistance values in order to reduce power consumption of the resistor circuit 23. Further, the decoupling capacitors Cp and Cn have relatively great capacitance in order to reliably reduce a change in voltage of the output terminal OUT. As a result, when trying to change a voltage generated by the resistor circuit 23, it takes a relatively long time for a voltage of the output terminal OUT to reach a target voltage.

To address such an issue, in the present embodiment, the capacitor circuit 24 is employed to change a voltage of the output terminal OUT to a different voltage in a shorter time. In the following description, processing of shifting an output voltage of the output terminal OUT from a certain voltage to another voltage having a different value is simply called voltage shift.

In FIG. 3, the control circuit 21 generates a 7-bit switching signal [6:0] for switching a voltage output from the output terminal OUT. The seven bits of the switching signal [6:0] represent a switching signal [6], a switching signal [5], a switching signal [4], a switching signal [3], a switching signal [2], a switching signal [1], and a switching signal [0], respectively.

The switching signal [6:0] is output to the decoder 22 and the capacitor circuit 24. The decoder 22 generates control signals for controlling on and off of the switches SW1 to SW4 based on the switching signal [6:0] and provides the control signals to the switches SW1 to SW4. Further, the capacitor circuit 24 provides the buffers B0 to B6 respectively with the switching signals [0] to [6], which are respective bits of the switching signal [6:0].

In the present embodiment, a voltage boost function or a voltage drop function is controlled by controlling the capacitors C0 to C6 according to the switching signal [ ]. Here, it is assumed that respective bits of the switching signal [6:0] are all "0" (i.e., at L level). In this case, output terminals of the buffers B0 to B6, that is, the first terminals of the capacitors C0 to C6 are all at the voltage VSSC. Thus, in this case, the output terminal OUT is equivalent to being connected to the ground through the capacitors C0 to C6. In contrast, when the respective bits of the switching signal [6:0] are all "1" (i.e., at H level), the output terminals of the buffers B0 to B6, that is, the first terminals of the capacitors C0 to C6 are all at the voltage VCCQ. Thus, in this case, the output terminal OUT is equivalent to being connected to a power supply terminal that supplies the voltage VCCQ through the capacitors C0 to C6.

It is assumed that a first terminal of a certain capacitor C changes from the voltage VSSC by the switching signal [ ] of L level before a voltage shift to the voltage VCCQ by the switching signal [ ] of H level after the voltage shift. Then, a second terminal of the capacitor C is changed (boosted) by VCCQ-VSSC immediately after the switching signal [ ] changes from L level to H level, thereby increasing a voltage of the output terminal OUT. That is, as the switching signal [ ] changes from L level to H level, a voltage boost function can work on the capacitor C.

Meanwhile, it is assumed that a first terminal of a certain capacitor C is changed from the voltage VCCQ by the switching signal [ ] of H level before a voltage shift to the voltage VSSC by the switching signal [ ] of L level after the voltage shift. Then, a second terminal of the capacitor C is changed (dropped) by VSSC-VCCQ immediately after the switching signal [ ] changes from H level to L level, thereby decreasing the voltage of the output terminal OUT. That is, as the switching signal [ ] changes from H level to L level, a voltage drop function can work on the capacitor C.

In the present embodiment, capacitance values are differentiated (e.g., incremental by $2^n$, n is an integer greater than 1) among the capacitors C0 to C6. Thus, by controlling the respective capacitors C0 to C6 according to the switching signal [ ], the voltage boost function or the voltage drop function can be controlled with a resolution of 7 bits (i.e., 128 steps). It is assumed that, for example, before and after the voltage shift, a state in which respective bits of the switching signal [6:0] are all "0" (i.e., L level) is changed to a state in which the switching signals [0] to [5] are all "0" and the switching signal [6] is "1". In this case, a weight of the capacitor C6 to which a voltage boost function is added by the switching signal [6] is about a half of all the capacitors C. From this, a voltage of the second terminal of each of the capacitors C0 to C6, that is, a voltage of the output terminal OUT changes from the voltage VSSC before the voltage shift to a voltage VCCQ/2 immediately after the voltage shift.

As described above, in the present embodiment, by setting a ratio between the total capacitance (hereinafter, referred to as voltage boost action capacitance) of capacitors that boost a voltage of the output terminal OUT and the total capacitance (hereinafter, referred to as voltage drop action capacitance) of capacitors that drop a voltage of the output terminal OUT, the voltage of the output terminal OUT is changed to a target voltage in a shorter time after the voltage shift.

In the present embodiment, the decoder 22 generates a control signal for turning on and off of the switches SW1 to SW4 so as to select a node that generates a voltage designated by the switching signal [6:0], based on the switching signal [6:0]. For example, it is assumed that, when a half voltage of the voltage VCCQ is generated in the node N2, a switching signal [6:0] for outputting the voltage VCCQ/2 from the output terminal OUT is generated by the control circuit 21. In this case, the decoder 22 generates control signals for turning off the switches SW1, SW3, and SW4 and for turning on the switch SW2.

The control circuit 21 controls the decoder 22 such that all the switches SW are turned off at a timing of the voltage shift and a control signal based on the switching signal [6:0] is supplied to the switches SW1 to SW4 after a predetermined time has elapsed from the voltage shift. For example, the control circuit 21 may generate a command for turning off all the switches SW a predetermined time before the voltage shift and supply the command to the decoder 22 for the voltage shift, and then may supply the switching signal [6:0] to the decoder 22 and the capacitor circuit 24 at the voltage shift. Thereby, even when switching timing of the switches SW is different from capacitance control switching timing of the capacitor circuit 24, output voltage after the voltage shift can become more stable due to less movement of electric charges stored in the capacitor circuit 24 to the resistor circuit 23 side or less movement of electric charges from the resistor circuit 23 to the capacitor circuit 24 side.

Further, a ratio (i.e., a voltage division ratio) between the voltage VCCQ and a voltage generated by the resistor circuit 23 is associated with a ratio between voltage boosting capacitance and voltage dropping capacitance.

Figure 5:
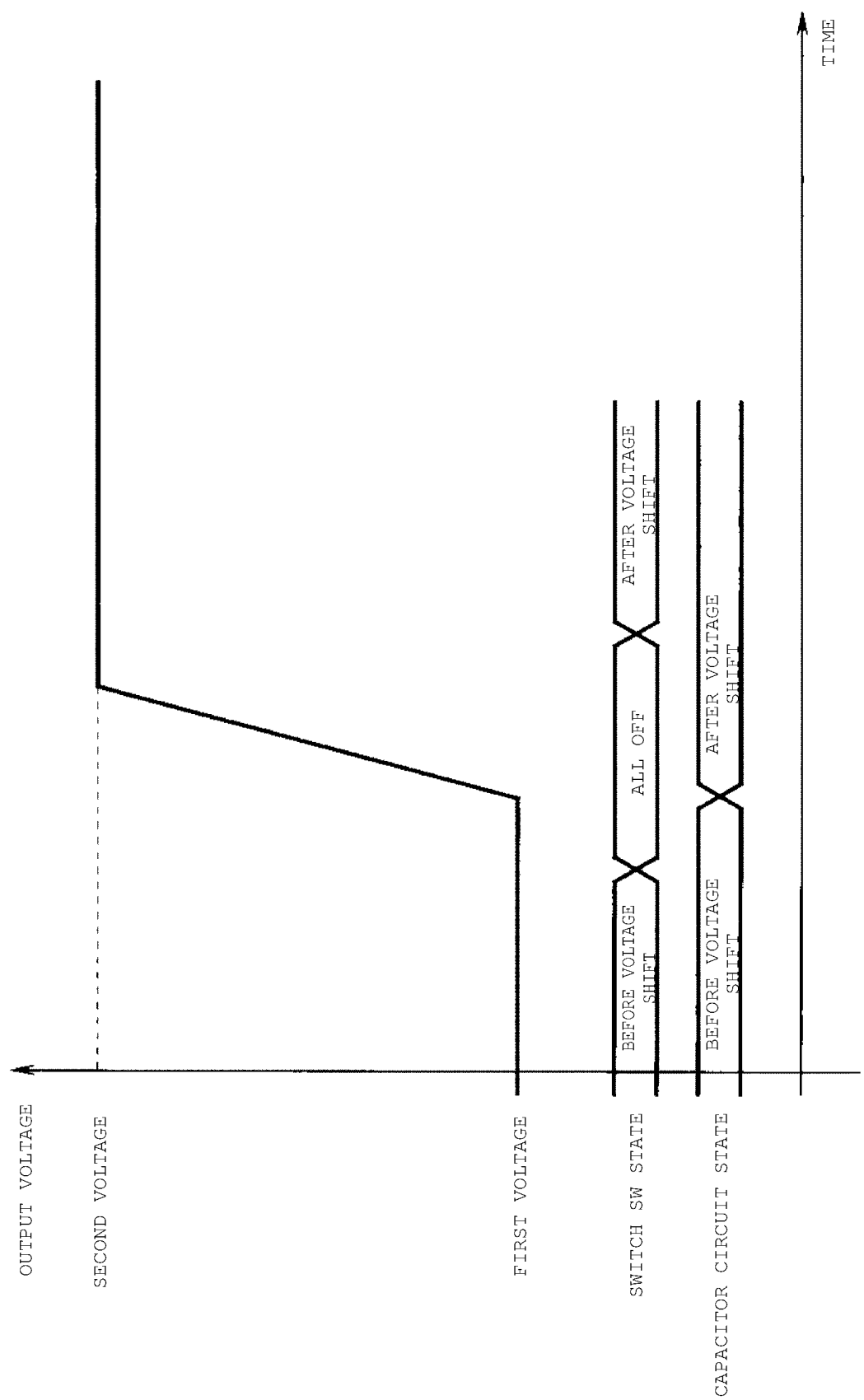
FIG. 5 is a diagram to explain an operation of the voltage generation circuit according to the first embodiment.

Next, an operation of the voltage generation circuit 17 according to the first embodiment configured as such will be described with reference to FIG. 5. FIG. 5 is a diagram to explain an operation of the voltage generation circuit 17 according to the first embodiment. FIG. 5 illustrates a change in output voltage of the output terminal OUT, a state of the switch SW, and a state of the capacitor circuit 24 by taking time on a horizontal axis.

Now, it is assumed that a first voltage supplied from the output terminal OUT is shifted to a second voltage. Further, it is assumed that the first voltage is generated at the node N4 and the second voltage is generated at the node N2. In this case, the control circuit 21 provides the decoder 22 with a switching signal [6:0] for turning on the switch SW4 and turning off the switches SW1 to SW3 before the voltage shift. Further, after the voltage shift, the control circuit 21 provides the decoder 22 with a switching signal [6:0] for turning on the switch SW2 and turning off the switches SW1, SW3, and SW4.

Further, for example, it is assumed that the first voltage is a voltage VCCQ/4 and the second voltage is a voltage VCCQ/2. Before the voltage shift, the control circuit 21 provides the capacitor circuit 24 with a switching signal [6:0] in which the switching signal [5] is "1" and the other switching signals [ ] are "0", and after the voltage shift, the control circuit 21 provides the capacitor circuit 24 with a switching signal [6:0] in which the switching signal [6] is "1" and the other switching signals [ ] are "0".

In a state before the voltage shift, the first voltage generated at the node N4 is selected by the switch SW4 and supplied to the output terminal OUT. As a result, the first voltage of a voltage VCCQ/4 is supplied to a load circuit from the output terminal OUT. Further, in a state before the voltage shift, the voltage VSSC is applied to the first terminal of each of the capacitors C0 to C4 and C6, and the voltage VCCQ is applied to the first terminal of the capacitor C5. As a result, the capacitor circuit 24 can generate a voltage VCCQ/4 and apply the voltage to the output terminal OUT. Further, the capacitors C0 to C6 function as decoupling capacitors to prevent the first voltage of the output terminal OUT from changing.

The control circuit 21 controls the decoder 22 to turn off all the switches SW immediately before a switching timing of the switches SW for the voltage shift the first voltage to the second voltage. The decoder 22 generates a control signal for turning off all the switches SW and supplies the control signal to the respective switches SW. Thereby, all the switches SW are turned off immediately before the switching timing from the first voltage to the second voltage.

Next, the control circuit 21 generates a switching signal [6:0] for switching the output terminal OUT to the second voltage and outputs the switching signal to the capacitor circuit 24. That is, a switching signal [6:0] in which the switching signal [6] is and the other switching signals [ ] are "0" is supplied to the capacitor circuit 24. Thereby, a first terminal of the capacitor C6 is at the voltage VCCQ, and a first terminal of each of the other capacitors C1 to C5 is at the voltage VSSC.

The capacitor C5 having the first terminal of which voltage is changed from the voltage VCCQ to the voltage VSSC works to drop a voltage of the output terminal OUT, and the capacitor C6 having the first terminal of which voltage is changed from the voltage VSSC to the voltage VCCQ works to boost a voltage of the output terminal OUT. The capacitance of the capacitor C6 is twice the capacitance of the capacitor C5, and as a result, the voltage of the output terminal OUT rapidly increases. In this way, the output terminal OUT reaches the second voltage (VCCQ/2) in a relatively shorter time after the voltage shift.

The control circuit 21 outputs a switching signal [6:0] for switching the output terminal OUT to the second voltage to the decoder 22. The decoder 22 generates a control signal for turning on the switch SW2 and turning off the other switches SW1, SW3, and SW4. In this way, the switch SW2 turns on, and thereafter, the second voltage generated in the node N2 is supplied to the output terminal OUT. Thereafter, the capacitors C0 to C6 function as decoupling capacitors to prevent a voltage of the output terminal OUT from changing from the second voltage.

As described above, the voltage generation circuit 17 of the present embodiment turns off all the switches SW at the time of the voltage shift, rapidly changes an output voltage to a desired output voltage by using the capacitor circuit 24, and then turns on the switch SW for generating the desired output voltage, thereby supplying the desired voltage from the resistor circuit 23 to an output terminal thereof. In this way, in the present embodiment, time required to shift the output voltage can be reduced, and the output voltage can be shifted to a desired voltage in a shorter time after the voltage shift. Further, at the time of the voltage shift, all the switches SW are turned off once, the switches SW are turned on after capacitors of the capacitor circuit 24 are switched, and thereby, the output voltage after the voltage shift can become stable more quickly.

SECOND EMBODIMENT

In the first embodiment, description is made by ignoring the load capacitor Cout. Meanwhile, in reality, capacitance obtained by combining capacitance of the capacitor C of the capacitor circuit 24 with capacitance of the load capacitor Cout contributes to boost or drop a voltage of the output terminal OUT. In addition, the load capacitor Cout is not fixed and may be different depending on systems.

Figure 6:
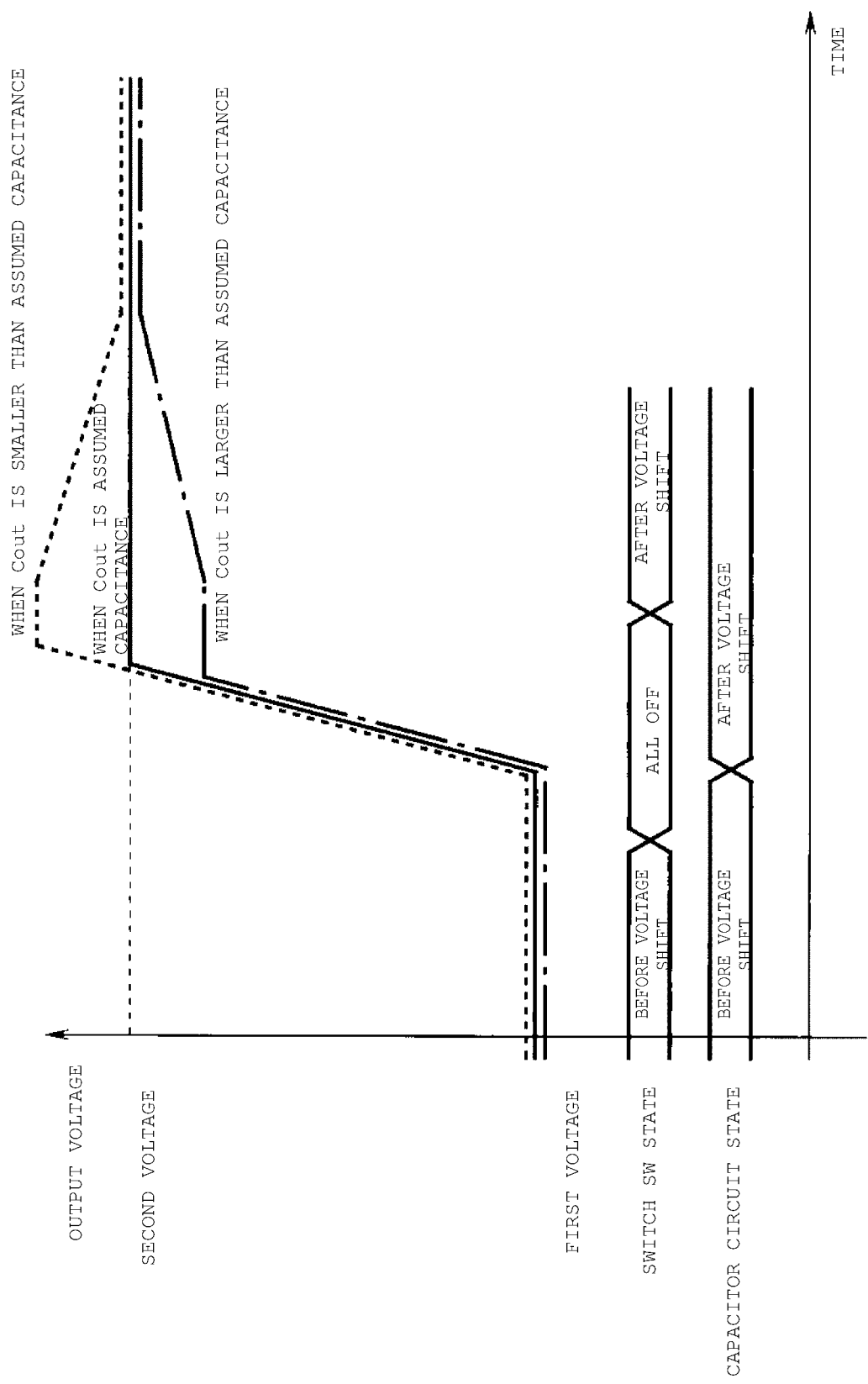
FIG. 6 is a diagram to explain a change in output voltage when capacitance of a load capacitor changes.

FIG. 6 is a diagram to explain an output voltage with respect to different capacitances of the load capacitor Cout.

Here, it is assumed that the load capacitor Cout has an assumed value of capacitance and controls the capacitor circuit 24 in the same manner as in the first embodiment. A solid line of an output voltage in FIG. 6 illustrates a change in the output voltage when the load capacitor Cout has the assumed value of capacitance and illustrates the same characteristics as in FIG. 5 described in the first embodiment. In the first embodiment, a voltage boost action is caused by the capacitor circuit 24 according to the total capacitance (voltage boosting capacitance) of the capacitors C each having a first terminal to which the voltage VCCQ is applied. Meanwhile, because there is the load capacitor Cout, a voltage drop action is performed according to the sum (voltage dropping capacitance) of the total capacitance of the capacitors C each having the first terminal to which the voltage VSSC is applied and the capacitance of the load capacitor Cout.

Thus, when the load capacitor Cout has a capacitance smaller than the assumed value, a ratio between the voltage boosting capacitance to the voltage dropping capacitance increases as the load capacitor Cout decreases, compared to when the load capacitor Cout has the assumed value of capacitance. Thus, as illustrated by a dashed line of an output voltage in FIG. 6, a voltage due to a voltage boosting action of the capacitor circuit 24 increases more than the desired voltage. In contrast, when the load capacitor Cout has a capacitance larger than the assumed value, the voltage due to the voltage boosting action of the capacitor circuit 24 decreases as illustrated by an alternate long and short dash line of the output voltage in FIG. 6, compared to when the load capacitor Cout has the assumed value of capacitance.

As a result, when the load capacitor Cout has a capacitance different from the assumed value, a relatively longer time is required until the output voltage of the output terminal OUT reaches the desired voltage, compared to when the load capacitor Cout has the assumed value of capacitance.

In order to address such an issue, a voltage generation circuit according to a second embodiment includes a capacitance-variable correction capacitor Cc for compensating a change amount of the load capacitor Cout. Then, a capacitance value of the correction capacitor Cc is changed according to a change of the load capacitor Cout. That is, by controlling the sum of capacitance of the load capacitor Cout and the capacitance of the correction capacitor Cc to be a constant value, a voltage of the output terminal OUT is boosted or dropped to reach the desired voltage by a voltage boosting action or a voltage dropping action of the capacitor circuit 24.

Because the load capacitor Cout and the correction capacitor Cc act as voltage dropping capacitors, even when the switching signals [ ] are all set to "1", a maximum value of an output voltage does not become the voltage VCCQ and becomes a voltage according to a ratio between the sum of capacitance of the load capacitor Cout and capacitance of the correction capacitor Cc and the total capacitance of the capacitors C0 to C6.

Figure 7:
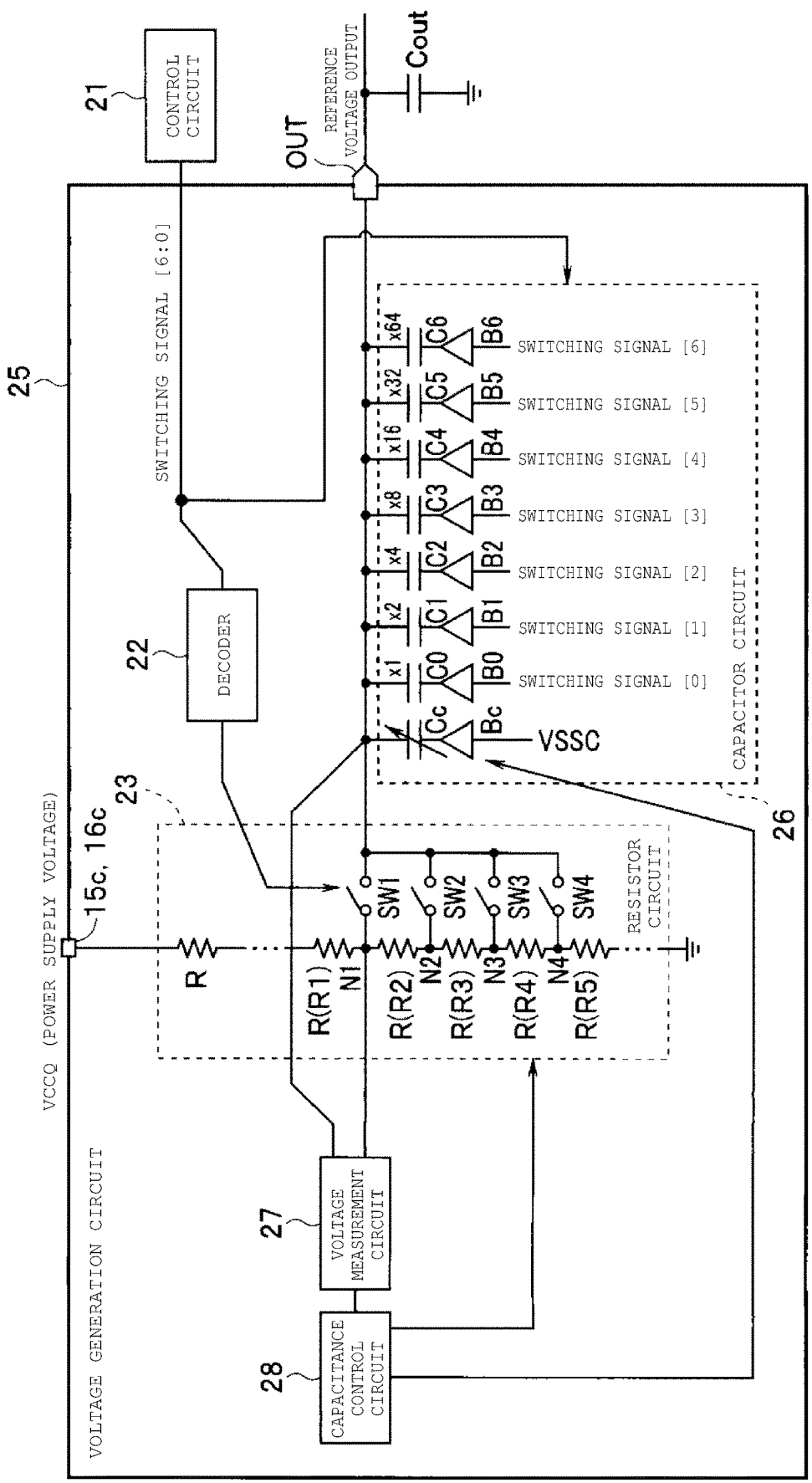
FIG. 7 is a circuit diagram illustrating an example of a configuration of a voltage generation circuit according to a second embodiment.

FIG. 7 is a circuit diagram illustrating an example of a configuration of the voltage generation circuit according to the second embodiment. In FIG. 7, the same components as in FIG. 1 are designated by the same reference numerals, and descriptions thereof are omitted.

As illustrated in FIG. 7, a voltage generation circuit 25 of the second embodiment is different from the voltage generation circuit 17 of the first embodiment in that the voltage generation circuit 25 includes a capacitor circuit 26, a voltage measurement circuit 27, and a capacitance control circuit 28. The capacitor circuit 26 is different from the capacitor circuit 24 of the first embodiment in that a correction capacitor Cc and a buffer Bc are added thereto. voltage VSSC is supplied to an input terminal of the buffer Bc, and the buffer Bc applies the voltage VSSC to a first terminal of the correction capacitor Cc. The capacitance of the correction capacitor Cc is variable, and the capacitance is changed according to a control signal from the capacitance control circuit 28. A variable range of the capacitance of the correction capacitor Cc is set to a change range of a capacitance assumed for the load capacitor Cout.

A voltage of the output terminal OUT and a voltage of the node N1 are supplied to the voltage measurement circuit 27. The voltage measurement circuit 27 measures the voltage of the output terminal OUT with reference to the voltage of the node N1. In addition, instead of the voltage of the node N1, a certain reference voltage may be supplied to the voltage measurement circuit 27.

The voltage measurement circuit 27 outputs a measurement result of the voltage of the output terminal OUT to the capacitance control circuit 28. The control circuit 21 instructs the capacitance control circuit 28 to operate in an adjustment mode. In the adjustment mode, optimal capacitance of the correction capacitor Cc is obtained and set as a correction capacitor Cc. The capacitance control circuit 28, in the adjustment mode, controls a resistor circuit 23 and the capacitor circuit 26.

That is, the capacitance control circuit 28 is controlled by the control circuit 21 in the adjustment mode and supplies a signal corresponding to a switching signal [6:0] to the capacitor circuit 26. Further, the capacitance control circuit 28 can supply an output corresponding to a control signal, which is output from the decoder 22, corresponding to the switching signal [6:0] to switches SW of the resistor circuit 23. The capacitance control circuit 28 measures a voltage of the output terminal OUT in the adjustment mode and controls a capacitance value of the correction capacitor Cc based on a measurement result. In the following description, for the sake of simplification, a signal output from the capacitance control circuit 28 to the capacitor circuit 26 and a signal supplied to the switches SW of the resistor circuit 23 are also described as the switching signal [6:0].

That is, the capacitance control circuit 28 monitors an output voltage of the output terminal OUT and sets a capacitance value of the correction capacitor Cc such that characteristics of the solid line in FIG. 6 can be obtained. The capacitance control circuit 28 increases the correction capacitor Cc when the output voltage is higher than a desired voltage and decreases the correction capacitor Cc when the output voltage is lower than the desired voltage. As such, the capacitance control circuit 28 controls an output voltage obtained by a voltage boosting action or a voltage dropping action of the capacitor circuit 26 to be matched with the desired voltage, thereby reducing the time required to shift the output voltage.

A capacitance value of the correction capacitor Cc may be set at the time of testing before products are shipped, or at the time of supplying power during actual use.

As such, in the present embodiment, by monitoring an output voltage and changing a capacitance value of a correction capacitor, the time required to shift the output voltage can be reduced regardless even if a capacitance value of a load capacitor is not an assumed value.

THIRD EMBODIMENT

Figure 8:
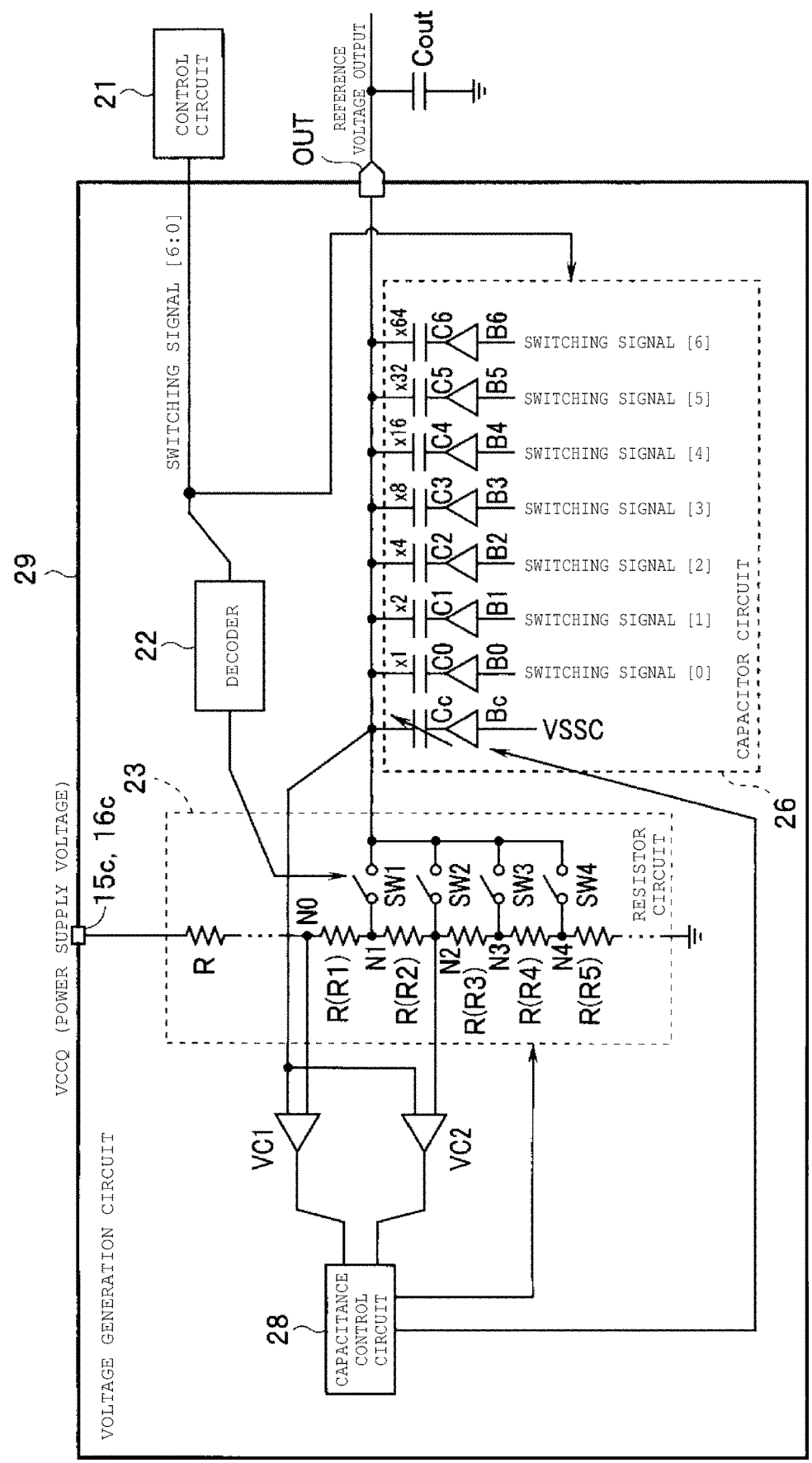
FIG. 8 is a circuit diagram illustrating an example of a configuration of a voltage generation circuit according to a third embodiment.

FIG. 8 is a circuit diagram illustrating an example of a configuration of a voltage generation circuit according to a third embodiment. In FIG. 8, the same components as in FIG. 7 are designated by the same reference numerals, and descriptions thereof are omitted. The third embodiment specifically involves a detailed control method of adjusting the correction capacitor Cc in the second embodiment.

As illustrated in FIG. 8, a voltage generation circuit 29 of the third embodiment is different from the voltage generation circuit 25 of the second embodiment in that comparators VC1 and VC2 are provided therein instead of the voltage measurement circuit 27. The comparators VC1 and VC2 each include a positive input terminal and a negative input terminal. The positive input terminal of the comparator VC1 is connected to an output terminal OUT, and the negative input terminal thereof is connected to a terminal of the resistor element R1 on the power supply terminal 15c or 16c side (hereinafter, referred to as a node N0). The comparator VC1 compares levels of the two inputs and outputs a comparison result. An output (the comparison result) of the comparator VC1 goes to H level when an output voltage of the output terminal OUT is higher than a voltage of the node N0 (hereinafter, referred to as a reference voltage V0), and goes to L level when the output voltage is lower than the reference voltage V0. The comparator VC1 supplies a comparison result of the two inputs to the capacitance control circuit 28.

Further, the positive input terminal of the comparator VC2 is connected to the output terminal OUT, and the negative input terminal thereof is connected to a node N2. The comparator VC2 compares levels of the two inputs and outputs a comparison result. An output (the comparison result) of the comparator VC2 goes to H level when the output voltage of the output terminal OUT is higher than a voltage of the node N2 (hereinafter, referred to as a reference voltage V2), and goes to L level when the output voltage is lower than the reference voltage V2. The comparator VC2 outputs a comparison result of the two inputs to the capacitance control circuit 28.

The capacitance control circuit 28 changes a capacitance value of the correction capacitor Cc while checking outputs of the comparators VC1 and VC2, thereby obtaining the capacitance value of the correction capacitor Cc that minimizes the time required to shift the output voltage.

In the present embodiment, in the adjustment mode for adjusting the capacitance of the correction capacitor Cc, the output voltage is shifted and the capacitance control circuit 28 measures time from start of a capacitance control of the capacitor circuit 26 to time when the output voltage reaches an acceptable voltage (hereinafter, referred to as convergence time). Then, shifting of the output voltage is repeated while changing the capacitance value of the correction capacitor Cc, and thereby, a capacitance value of the correction capacitor Cc when the convergence time is the shortest is obtained.

In the example of the circuit of FIG. 8, a voltage (hereinafter, referred to as a voltage V1) generated at the node N1 is assumed to be an output voltage after the voltage shift in the adjustment mode. That is, in the adjustment mode, the output voltage is shifted and the capacitance control circuit 28 generates a switching signal [6:0] for selecting a switch SW1 from a state in which switches other than the switch SW1 are selected. In this case, the output voltage of the output terminal OUT finally converges to the voltage generated in the node N1 regardless of a capacitance value of the correction capacitor Cc.

The capacitance control circuit 28 changes the capacitance value of the correction capacitor Cc each time the voltage shift is carried out in the adjustment mode, and measures the convergence time. In the present embodiment, time from start of the voltage shift to the time when the output voltage converges into an allowable voltage range including a desired voltage is measured as the convergence time. For example, in the present embodiment, a voltage generated at the node N1 is set to the desired voltage, the reference voltage V0 generated at the node N0 is set to an upper limit voltage in the allowable voltage range, and the reference voltage V2 generated in the node N2 is set to a lower limit voltage in the allowable voltage range.

The capacitance control circuit 28 samples outputs of the comparators VC1 and VC2, determines whether the voltage of the output terminal OUT is higher or lower than the voltage of the node N0 which is the upper limit voltage, based on a change in levels of the sampled outputs of the comparators VC1 and VC2, and determines whether the voltage of the output terminal OUT is higher or lower than the voltage of the node N2 which is the lower limit voltage. The capacitance control circuit 28 obtains the convergence time from the outputs of the comparators VC1 and VC2 until the voltage of the output terminal OUT converges to a voltage between the upper limit voltage and the lower limit voltage and obtains capacitance of the correction capacitor Cc for obtaining the shortest convergence time. A sampling clock (CLK) is given to the capacitance control circuit 28, and the convergence time is measured by counting the sampling clock CLK.

Figure 9:
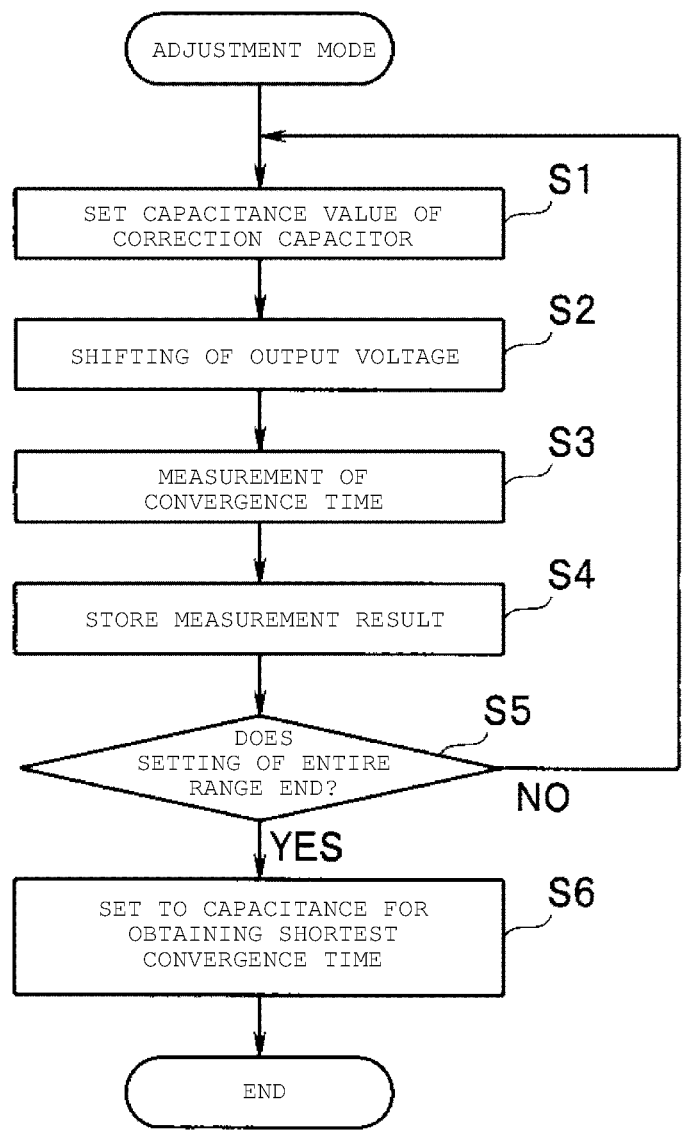
FIG. 9 is a flowchart illustrating an operation of the voltage generation circuit according to the third embodiment.
Figure 10:
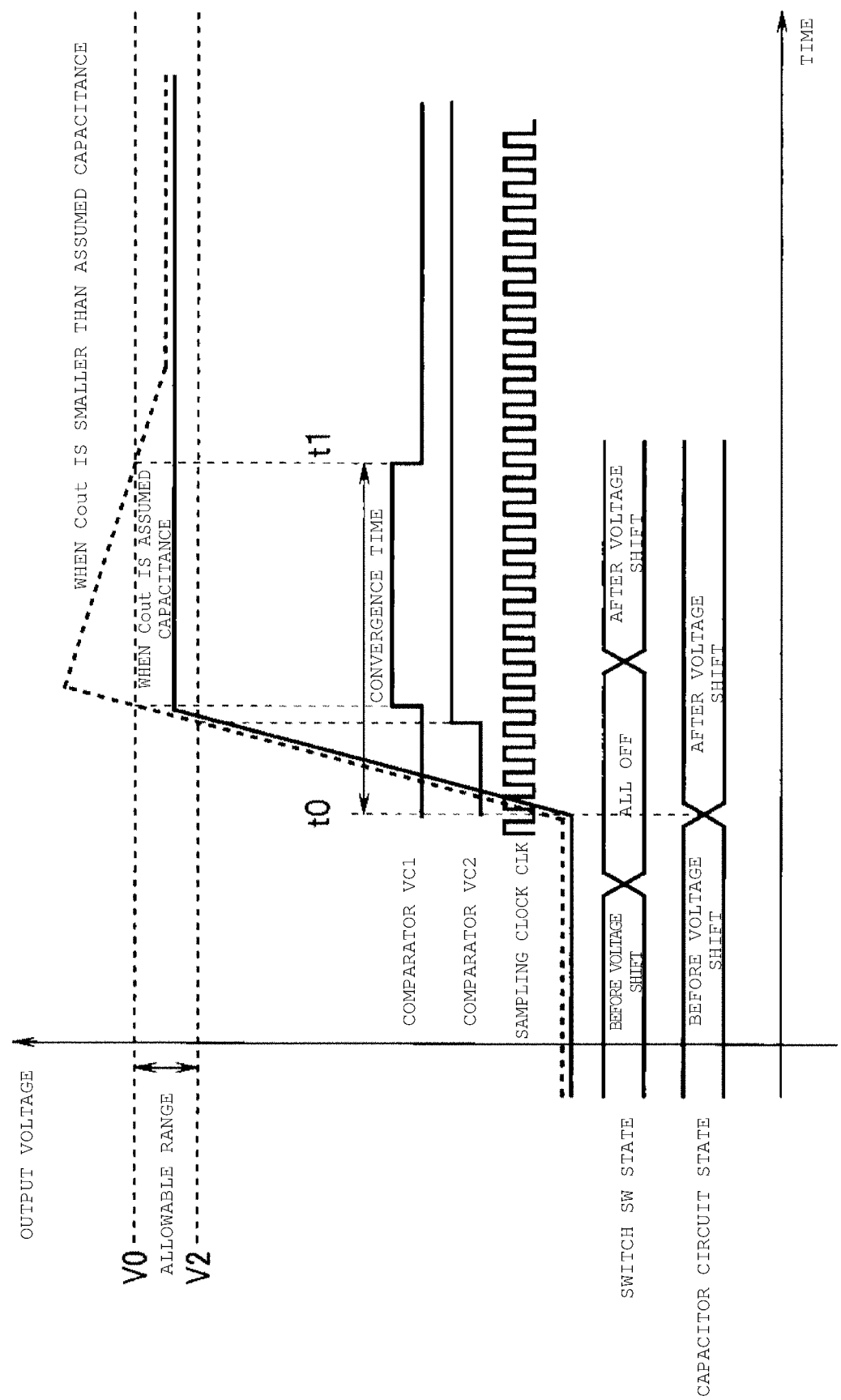
FIG. 10 is a diagram to explain an operation of the voltage generation circuit according to the third embodiment.

Next, an operation of the voltage generation circuit according to the third embodiment configured as such will be described with reference to FIGS. 9 and 10. FIG. 9 is a flowchart illustrating an operation of the voltage generation circuit according to the third embodiment. FIG. 10 is a diagram to explain the operation of the voltage generation circuit according to the third embodiment using the same manner as represented in FIG. 7. FIG. 10 illustrates that outputs of the comparators VC1 and VC2 and waveforms of the sampling clock (CLK) are added to FIG. 7.

In the adjustment mode, the capacitance control circuit 28 sets a capacitance value of the correction capacitor Cc to a certain capacitance (S1 in FIG. 9). The capacitance control circuit 28 generates a switching signal [6:0] for changing an output voltage to a voltage of the node N1 and switches the output voltage (S2). Thereby, after the switches SW are all turned off, voltage boosting capacitance and voltage dropping capacitance of the capacitor circuit 26 are set. In this way, for example, at a timing t0 of FIG. 10, the output voltage starts to rise due to a voltage boosting action of the capacitor circuit 26. In order to measure convergence time, the capacitance control circuit 28 starts to count the sampling clock CLK from start of a shifting time point t0 of the output voltage and monitors outputs of the comparators VC1 and VC2 (S3).

The voltage V1 in the adjustment mode is a voltage between the reference voltage V0 of the node N0 and the reference voltage V2 of the node N2. Thus, the output voltage first reaches either the reference voltage V0 or the reference voltage V2 before reaching the voltage V1. In the example of FIG. 10, the voltage of the output terminal OUT first reaches the reference voltage V2. Thereby, an output of the comparator VC2 first changes from L level to H level. Now, as in the example of FIG. 10, it is assumed that a capacitor smaller than the load capacitor Cout is set as the correction capacitor Cc. In this case, an output voltage due to the voltage boosting action of the capacitor circuit 26 is higher than the voltage V1. Depending on setting of the reference voltage V0, the output voltage is higher than the reference voltage V0. When the output voltage is higher than the reference voltage V0, an output of the comparator VC1 changes from L level to H level.

After voltage boosting by the capacitor circuit 26 is completed, the switch SW1 is turned on. Then, the output voltage changes toward the voltage V1. In the example of FIG. 10, at a timing t1, the output voltage is lower than the reference voltage V0. Thereby, the output of the comparator VC1 changes from H level to L level. The capacitance control circuit 28 detects that the output voltage is within an allowable voltage range from outputs of the comparators VC1 and VC2 and obtains a count number from t0 to t1 as the convergence time. The capacitance control circuit 28 stores correspondence between the obtained convergence time and a set value of the correction capacitor Cc at that time in a memory (not illustrated) (S4 of FIG. 9).

The capacitance control circuit 28 repeats processing of S1 to S4 while changing the capacitance value of the correction capacitor Cc. The capacitance control circuit 28 determines whether or not the capacitance value of the correction capacitor Cc is set for an entire variable range of the capacitance value of the correction capacitor Cc (S5). When determined as NO in S5, the capacitance control circuit 28 returns the processing to S1 and repeats S1 to S4, and when determined as YES in S5, the processing proceeds to S6. The capacitance control circuit 28 sets the capacitance value of the correction capacitor Cc to capacitance for obtaining the shortest convergence time (S6). The capacitance control circuit 28 changes the capacitance value of the correction capacitor Cc during the processing of S1 after the NO determination of S5.

In this way, according to the present embodiment, the shortest convergence time can be obtained even if the capacitance of the load capacitor Cout is not an assumed value.

As described above, in the present embodiment, the allowable voltage range including the desired output voltage is set, the convergence time is detected by obtaining a timing when an output voltage reaches an upper limit and a lower limit of the allowable voltage range, and a capacitance value for obtaining the shortest convergence time is set to a correction capacitor. Thereby, the shortest convergence time can be obtained regardless of a capacitance value of the load capacitor.

FOURTH EMBODIMENT

Figure 11:
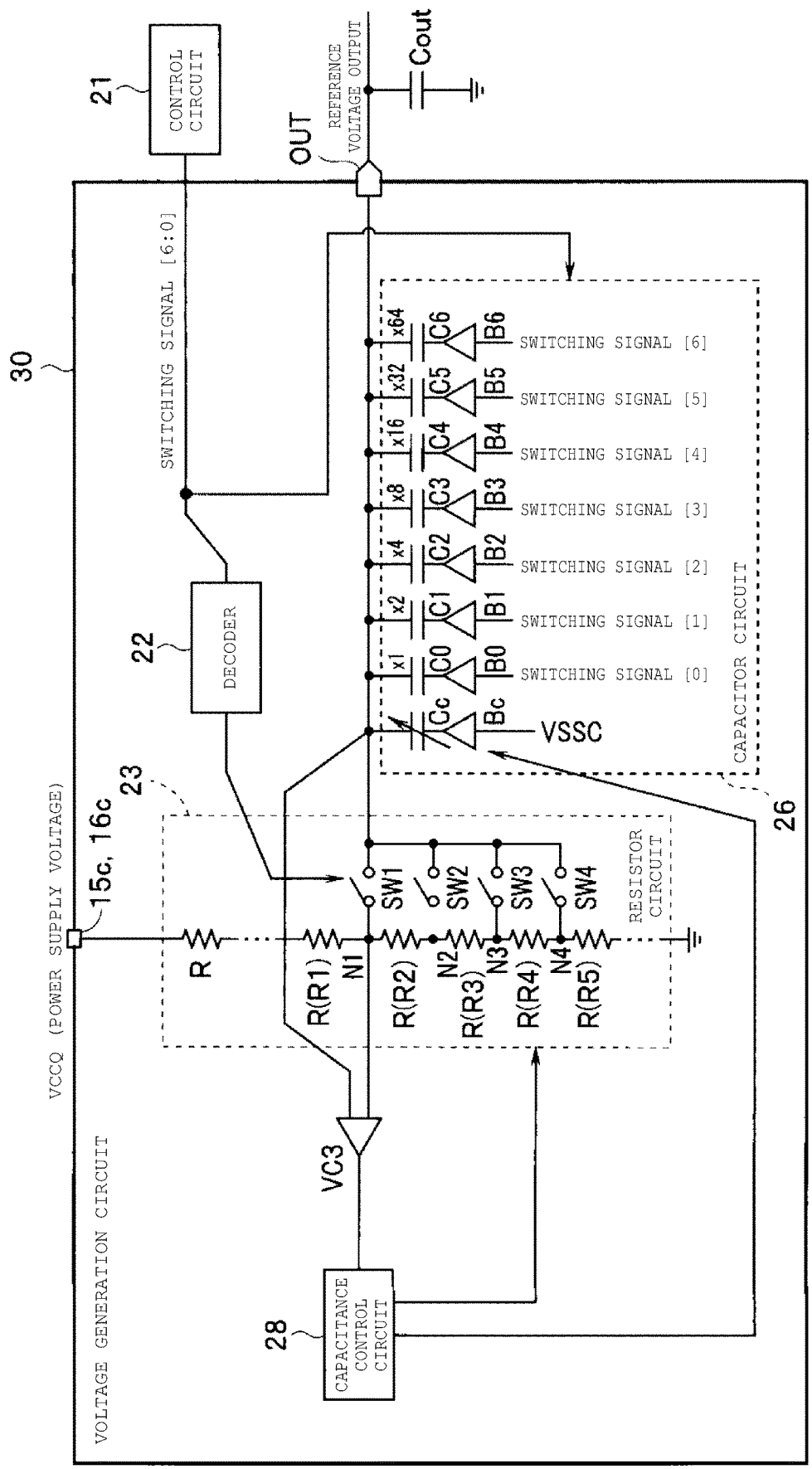
FIG. 11 is a circuit diagram illustrating an example of a configuration of a voltage generation circuit according to a fourth embodiment.

FIG. 11 is a circuit diagram illustrating an example of a configuration of a voltage generation circuit according to a fourth embodiment. In FIG. 11, the same components as in FIG. 8 are designated by the same reference numerals, and descriptions thereof are omitted.

In the adjustment mode in the third embodiment, by turning on the switch SW1 after the voltage shift and measuring the convergence time until the output voltage converges to a desired voltage, an optimal capacitance value of the correction capacitor Cc is obtained. In the adjustment mode in the present embodiment, a level of an output voltage obtained by a voltage boost action or a voltage drop action is maintained by keeping all the switches SW off after the voltage shift. The output voltage is measured in this state, and a capacitance value of the correction capacitor Cc when an output voltage closest to a desired voltage is obtained is obtained as appropriate capacitance.

As illustrated in FIG. 11, a voltage generation circuit 30 of the fourth embodiment is different from the voltage generation circuit 29 of the third embodiment in that a comparator VC3 is provided instead of the comparators VC1 and VC2. A positive input terminal of the comparator VC3 is connected to an output terminal OUT, and a negative input terminal thereof is connected to a node N1. The comparator VC3 compares levels of two inputs and outputs a comparison result. An output (a comparison result) of the comparator VC3 goes to H level when an output voltage of the output terminal OUT is higher than a voltage (a voltage V1) of the node N1 and goes to L level when the output voltage is lower than the voltage V1. The comparator VC3 supplies a comparison result of the two inputs to the capacitance control circuit 28.

In the present embodiment, in an adjustment mode, the capacitance control circuit 28 can generate a control signal for turn-on and turn-off of each of the switches SW prioritized over a switching signal [6:0], separately from the switching signal [6:0] and can supply the control signal to the respective switches SW.

Next, an operation of the voltage generation circuit according to the fourth embodiment configured as such will be described with reference to FIG. 12. FIG. 12 is a diagram to explain the operation of the voltage generation circuit according to the fourth embodiment using the same manner as represented in FIG. 6. FIG. 12 illustrates a change in output voltage of the output terminal OUT, a state of the switch SW, a state of the capacitor circuit 24, and a waveform of an output of the comparator VC3.

In the adjustment mode, the capacitance control circuit 28 sets a capacitance value of the correction capacitor Cc to a certain capacitance. The capacitance control circuit 28 outputs a switching signal [6:0] when shifting the output voltage to a voltage of the node N1. The capacitance control circuit 28 supplies a control signal for turning off all the switches SW to the respective switches SW a predetermined period before the generation of the switching signal [6:0]. After all the switches SW are turned off by the control, voltage boosting capacitance and voltage dropping capacitance of the capacitor circuit 26 are set by the switching signal [6:0] from the capacitance control circuit 28. For example, as illustrated in FIG. 12, it is assumed that the output voltage starts to rise due to the voltage boosting action of the capacitor circuit 26. In the present embodiment, a value corresponding to the voltage V1 at the node N1 is used as the switching signal [6:0].

In the present embodiment, the capacitor circuit 26 performs a voltage boosting action or a voltage dropping action according to the switching signal [6:0], and the capacitance control circuit 28 keeps all the switches SW off regardless of a value of the switching signal [6:0]. Then, the output voltage is boosted or dropped according to the voltage boosting action or the voltage dropping action of the capacitor circuit 26, reaches a voltage corresponding to the voltage boosting capacitance and the voltage dropping capacitance, and substantially maintains the voltage.

The capacitance control circuit 28 determines an output of the comparator VC3 by using a timing when the output voltage stabilizes after a certain time has elapsed from a shifting time point of the output voltage as a detection timing. When an output voltage of the output terminal OUT is lower than the voltage V1 at the node N1, the output of the comparator VC3 goes to L level, and when the output voltage thereof is higher than the voltage V1 at the node N1, the output of the comparator VC3 goes to H level. The capacitance control circuit 28 stores correspondence between the output of the comparator VC3 and a setting value of the correction capacitor Cc at that time in a memory (not illustrated).

The capacitance control circuit 28 sets, as an optimal capacitance value, the capacitance value of the correction capacitor Cc when the output of the comparator VC3 changes from L level to H level, or the capacitance value of the correction capacitor Cc when the output of the comparator VC3 changes from H level to L level, while changing the capacitance value of the correction capacitor Cc. For example, the capacitance control circuit 28 may determine the correction capacitor Cc at a point in time when the output of the comparator VC3 changes from L level to H level or immediately before that as an appropriate capacitor while changing the switching signal [6:0] such that the voltage boosting capacitance gradually increases. Further, conversely, the capacitance control circuit 28 may determine the correction capacitor Cc at a point in time when the output of the comparator VC3 changes from H level to L level or immediately before that as an appropriate capacitor while changing the switching signal [6:0] such that the voltage boosting capacitance gradually decreases. Further, the capacitance control circuit 28 may determine the correction capacitor Cc at a point in time when the output of the comparator VC3 changes from L level to H level or from H level to L level or immediately before that as an appropriate capacitor while changing the switching signal [6:0] such that the voltage boosting capacitance changes to enable sequential comparison.

As such, in the present embodiment, the output voltage reached by the voltage boosting action or the voltage dropping action of a capacitor circuit is maintained, the output voltage is compared with a desired voltage, and thus, a capacitance value of a correction capacitor when the output voltage approaches the desired voltage is set to an optimal capacitance value. Thereby, the shortest convergence time can be obtained regardless of the capacitance of the load capacitor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A voltage generation circuit comprising:
a first input terminal at a power supply voltage;
a second input terminal at a reference voltage lower than the power supply voltage;
an output terminal from which an output voltage is output;
a resistor circuit including a plurality of resistors connected in series between the first input terminal and the second input terminal, and a plurality of switching elements connected between the output terminal and a respective one of a plurality of nodes that are between adjacent two of the resistors; and
a capacitor circuit including a plurality of capacitors, each of which has a first terminal to which a first voltage or a second voltage is applicable and a second terminal connected to the output terminal, wherein
the first voltage or the second voltage is selectively applied to the first terminals of the capacitors in accordance with a target value of the output voltage, and
one of the switching elements corresponding to the target value of the output voltage is turned on and the other switching elements are turned off.

2. The voltage generation circuit according to claim 1, wherein
the first voltage is selectively applied to one or more of the first terminals of the capacitors while all of the switching elements are turned off, and
the one of the switching elements is turned on while the first voltage is being selectively applied to the one or more of the first terminals of the capacitors.

3. The voltage generation circuit according to claim 1, wherein the first voltage is selectively applied to one or more of the first terminals of the capacitors when the target value of the output voltage is shifted.

4. The voltage generation circuit according to claim 1, wherein the first voltage is the power supply voltage and the second voltage is the reference voltage.

5. The voltage generation circuit according to claim 1, wherein the plurality of capacitors includes a first capacitor having a first capacitance, a second capacitor having a second capacitance that is twice the first capacitance, and a third capacitor having a third capacitance that is twice the second capacitance.

6. The voltage generation circuit according to claim 1, wherein
when the target value is a first value, the first voltage is selectively applied to a set of the first terminals of the capacitors, and
when the target value is a second value different from the first value, the first voltage is selectively applied to a different set of the first terminals of the capacitors.

7. The voltage generation circuit according to claim 1, wherein the capacitor circuit further includes a variable capacitor having a first terminal at the second voltage and a second terminal connected to the output terminal.

8. The voltage generation circuit according to claim 7, further comprising:
a control circuit configured to control a capacitance of the variable capacitor based on the output voltage.

9. The voltage generation circuit according to claim 8, wherein the control circuit is further configured to control the capacitance of the variable capacitor to be a first capacitance when the output voltage exceeds the target value, and to be a second capacitance less than the first capacitance when the output voltage does not exceed the target value.

10. The voltage generation circuit according to claim 8, wherein the control circuit is further configured to:
measure a time period from the application of the first voltage selectively to one or more of the first terminals of the capacitors until the output voltage converges to a voltage range including the target voltage; and
control the capacitance of the variable capacitor to be a certain value that minimizes the time period.

11. The voltage generation circuit according to claim 10, further comprising:
a first comparator configured to compare the output voltage with an upper limit of the voltage range; and
a second comparator configured to compare the output voltage with a lower limit of the voltage range, wherein
the control circuit is further configured to measure the time period based on comparison results of the first and second comparators.

12. The voltage generation circuit according to claim 8, wherein
the control circuit is further configured to maintain all of the switching elements to be turned off, and
the first voltage is selectively applied to one or more of the first terminals of the capacitors while all of the switching elements are maintained to be turned off.

13. The voltage generation circuit according to claim 12, wherein
the control circuit is further configured to control the capacitance of the variable capacitor based on a converged value of the output voltage.

14. An interface circuit comprising:
the voltage generation circuit according to claim 1;
a first circuit configured to generate a signal that causes the first voltage to be selectively applied to one or more of the first terminals of the capacitors and the second voltage to be applied to the other of the first terminals of the capacitors; and
a second circuit configured to determine a logic level of a signal transmitted to the interface circuit using the output voltage.

15. A voltage generation circuit comprising:
a first input terminal at a power supply voltage;
a second input terminal at a reference voltage lower than the power supply voltage;
an output terminal from which an output voltage is output;
a resistor circuit including a plurality of resistors connected in series between the first input terminal and the second input terminal, and a plurality of switching elements connected between the output terminal and a respective one of a plurality of nodes that are between adjacent two of the resistors;
a capacitor circuit including:
a plurality of capacitors, each of which has a first terminal to which a first voltage or a second voltage is applicable and a second terminal connected to the output terminal; and
a variable capacitor having a first terminal at the second voltage and a second terminal connected to the output terminal; and
a control circuit configured to control a capacitance of the variable capacitor based on the output voltage.

16. The voltage generation circuit according to claim 15, wherein the control circuit is further configured to control the capacitance of the variable capacitor to be a first capacitance when the output voltage exceeds the target value, and to be a second capacitance less than the first capacitance when the output voltage does not exceed the target value.

17. An interface circuit comprising:
the voltage generation circuit according to claim 16;
a first circuit configured to generate a signal that causes the first voltage to be selectively applied to one or more of the first terminals of the capacitors and the second voltage to be applied to the other of the first terminals of the capacitors; and
a second circuit configured to determine a logic level of a signal transmitted to the interface circuit using the output voltage.

18. A method for controlling a voltage generation circuit including:
a first input terminal at a power supply voltage;
a second input terminal at a reference voltage lower than the power supply voltage;
an output terminal from which an output voltage is output;
a resistor circuit including a plurality of resistors connected in series between the first input terminal and the second input terminal, and a plurality of switching elements connected between the output terminal and a respective one of a plurality of nodes that are between adjacent two of the resistors; and
a capacitor circuit including a plurality of capacitors, each of which has a first terminal to which a first voltage or a second voltage is applicable and a second terminal connected to the output terminal, the method comprising:
selectively applying the first voltage to one or more of the first terminals of the capacitors in accordance with a target value of the output voltage; and
applying the second voltage to the other of the first terminals of the capacitors.

19. The method according to claim 18, further comprising:
turning off all of the switching elements, wherein said applying the first voltage is carried out to the one or more of the first terminals of the capacitors while all of the switching elements are turned off; and
turning on one of the switching elements while the first voltage is being selectively applied to the one or more of the first terminals of the capacitors.

* * * * *